(12) United States Patent
Iotti et al.

(10) Patent No.: US 9,667,192 B2
(45) Date of Patent: May 30, 2017

(54) OSCILLATOR CIRCUIT, CORRESPONDING APPARATUS AND METHOD

(71) Applicant: STMicroelectronics S.r.l., Agrate Brianza (IT)

(72) Inventors: Lorenzo Iotti, Pavia (IT); Andrea Mazzanti, Modena (IT); Andrea Pallotta, Rho (IT); Francesco Svelto, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/146,977

(22) Filed: May 5, 2016

(65) Prior Publication Data

US 2017/0104453 A1    Apr. 13, 2017

(30) Foreign Application Priority Data

Oct. 8, 2015 (IT) .................. UB15A4230

(51) Int. Cl.
*H03B 5/12* (2006.01)
*H03B 27/00* (2006.01)
*H03B 1/00* (2006.01)

(52) U.S. Cl.
CPC ............ *H03B 5/1206* (2013.01); *H03B 1/00* (2013.01); *H03B 5/124* (2013.01); *H03B 27/00* (2013.01)

(58) Field of Classification Search
CPC ...... H03B 28/00; H03B 5/124; H03B 5/1206; H03B 27/00; H03B 1/00
USPC ........... 331/167, 117 R, 117 FE, 2, 46, 36 C, 331/177 V; 375/279; 455/260
See application file for complete search history.

(56) References Cited

U.S. PATENT DOCUMENTS

| 8,558,625 | B1 | 10/2013 | Lie et al. | |
| 8,797,105 | B2 * | 8/2014 | Afshari | H03B 28/00 331/135 |
| 9,356,556 | B1 * | 5/2016 | Raj | H03B 5/124 |
| 2002/0003452 | A1 * | 1/2002 | Mizuno | G06F 1/10 331/2 |
| 2007/0182493 | A1 | 8/2007 | Sai et al. | |

(Continued)

FOREIGN PATENT DOCUMENTS

| EP | 0147897 A2 | 7/1985 |
| EP | 2961062 A2 | 12/2015 |

OTHER PUBLICATIONS

IT Search Report and Written Opinion for IT 102015000059509 dated Jun. 10, 2016 (8 pages).

(Continued)

*Primary Examiner* — Arnold Kinkead
(74) *Attorney, Agent, or Firm* — Gardere Wynne Sewell LLP

(57) ABSTRACT

An oscillator has an oscillator output emitting an oscillating signal. The oscillator includes oscillator cores which each have a same circuit topology. A set of configuration switches couple a selected number of oscillator cores in parallel to generate the oscillating signal. The oscillator cores are arranged with a symmetry around a central axis. The planar inductors of the oscillator cores are arranged in a petal-like pattern with the planar inductors forming the petals of the petal-like pattern. The selected coupling of the oscillator cores in made in response to a selected phase noise threshold of a modulation device which receives the oscillating signal.

7 Claims, 2 Drawing Sheets

(56) References Cited

U.S. PATENT DOCUMENTS

2011/0032040 A1 2/2011 Beghini
2011/0057732 A1 3/2011 Taylor et al.
2013/0120074 A1 5/2013 Zuo et al.
2013/0222070 A1 8/2013 Liscidini et al.

OTHER PUBLICATIONS

Tohidian, M. et al.: "Dual-Core High-Swing Class-C Oscillator with Ultra-Low Phase Noise", 2013 IEEE Radio Frequency Integrated Circuits Symposium, pp. 243-246.

* cited by examiner

OSCILLATOR CIRCUIT, CORRESPONDING APPARATUS AND METHOD

PRIORITY CLAIM

This application claims priority from Italian Application for Patent No. 102015000059509 filed Oct. 8, 2015, the disclosure of which is incorporated by reference.

TECHNICAL FIELD

The description relates to oscillator circuits.

One or more embodiments relate to VCO oscillators for use e.g. in mobile terminals or, more generally, for RF local oscillators as used e.g. mobile phones, cellular network infrastructure equipment, Wi-Fi terminals and access points.

BACKGROUND

Frequency synthesis with low phase noise achieved with a reasonable trade-off in terms of overall power consumption represents a valuable goal for oscillator circuits such as e.g. voltage controlled oscillator (VCOs) for high spectral efficiency wireless links.

SUMMARY

According to one or more embodiments, an oscillator circuit is provided.

One or more embodiments may also relate to corresponding apparatus (e.g. a mobile terminal or, more generally, any apparatus including a RF oscillator) as well as a corresponding method.

In one or more embodiments, various oscillator cores (e.g. VCO cores) may be switched on or off based e.g. on system-required phase noise performance.

In one or more embodiments, the overall phase noise may thus be adapted (possibly in a dynamical way) to application specifications.

In one or more embodiments, plural oscillator cores may be connected in parallel and laid out circularly, e.g. as the petals of a flower, while maintaining a central symmetry.

In one or more embodiments, oscillator overall power consumption may be reduced, while central symmetry may facilitate reducing the noise current due to core mismatching while lowering interconnection impedance.

BRIEF DESCRIPTION OF THE DRAWINGS

One or more embodiments will now be described, by way of example only, with reference to the annexed figures, wherein.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
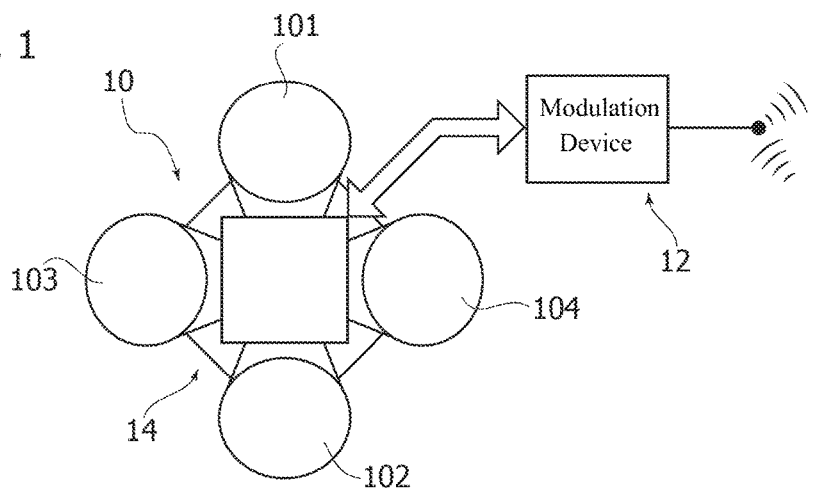
FIG. 1 is a schematic functional diagram of apparatus including an oscillator circuit.

FIG. 1 is representative of a possible layout of an apparatus including an oscillator circuit 10 for emitting an oscillating signal for use e.g. by a modulation device 12. As used herein, the designation "modulation device" is intended to designate any of a modulator, a demodulator and a modulator/demodulator device.

The general layout exemplified in FIG. 1 may be exemplary of a wide variety of apparatus such as mobile terminals or, in general, apparatus including RF (e.g. local) oscillators. Mobile phones, cellular network infrastructure equipment, Wi-Fi terminals and access points may be exemplary of such apparatus.

Modulation devices as exemplified in 12 may be fed with an oscillating signal from an oscillator output of the oscillator circuit 10 and may be operated with different modulation schemes (e.g. QPSK, 16QAM, 64QAM, . . . ) providing different degrees of spectral efficiency (Bit/sec/Hz).

Operation with different modulation schemes may involve compliance with different phase noise thresholds.

For instance, modulator devices adapted to operate with modulation schemes such as QPSK, 16QAM, 64QAM in an E-band wireless link may comply with phase noise (PN) specifications of −86 dBc, −93 dBc and −99 dBc, respectively, plus a possible 10 dB margin.

In applications such as those exemplified in FIG. 1 the modulation device 12 may thus be operated in compliance with difference phase noise thresholds depending on the type of modulation (e.g. QPSK, 16QAM, 64QAM, and so on).

One or more embodiments permit to dynamically adjust phase noise performance of the oscillator 10 (e.g. a VCO) in order to comply e.g. with more or less stringent phase noise thresholds. Also, in one or more applications scaling the RF frequency synthesis design up to millimeter-waves may be an asset.

Documents such as M. Tohidian, et al.: "Dual-Core High-Swing Class-C Oscillator with Ultra-Low Phase Noise", 2013 IEEE Radio Frequency Integrated Circuits Symposium, pp. 243-246 (incorporated by reference) have already proposed a parallel-coupled oscillator core architecture which may lower the phase noise of a VCO by a factor of N, where N is the number of the VCO cores. By resorting to such an approach, the overall power consumption of the oscillator may increase by a factor of N.

Also, more than two cores may be difficult to lay out e.g. due to an increase in interconnection impedance. The possibility of resorting to a reconfigurable oscillator layout is disclosed e.g. in U.S. Patent Application Publication No. 2013/0222070 A1 (incorporated by reference).

Figure 2:
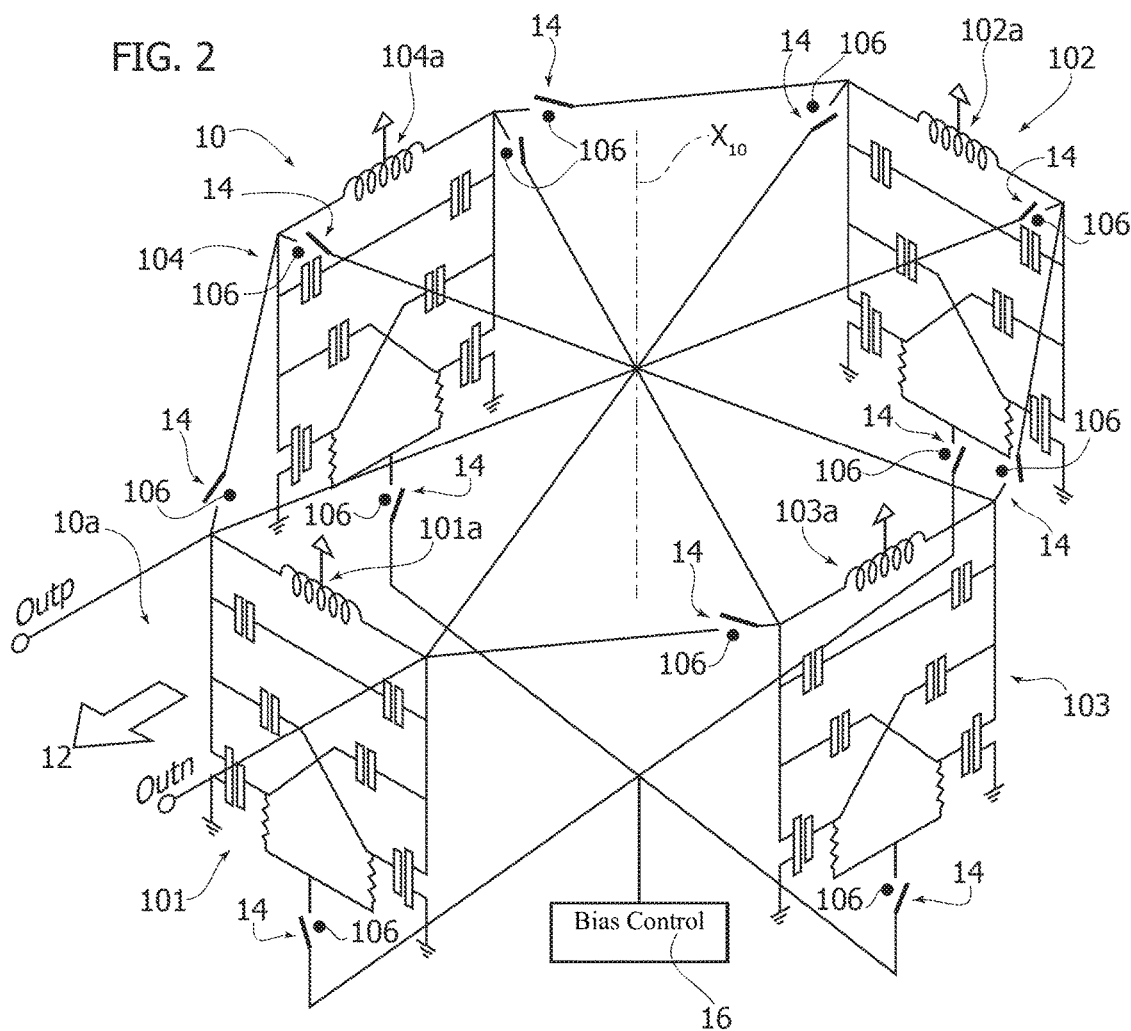
FIG. 2 is a schematic representation of an oscillator circuit.

Reference is now made to FIG. 2. In one or more embodiments, an oscillator circuit 10 having an output 10a for emitting an oscillating signal may include a plurality of oscillator cores 101, 102, 103, 104 and a set of configuration switches 14 configured for selectively coupling to the oscillator output 10a a selected number (e.g. one, two, three, . . . ) of oscillator cores from the plurality of oscillator cores 101 to 104.

In one or more embodiments, the set of configuration switches 14 may be coupled with and controlled by the modulation device 12 to selectively vary the number of oscillator cores 101, 102, 103, 104 coupled with the oscillator output 10a as a function of the phase noise threshold (e.g. the modulation scheme) at which the modulation device 12 is being operated.

For instance:
one oscillator core (e.g. 101) may be coupled to the oscillator output 10a in the case of QPSK operation,
two oscillator cores (e.g. 101, 102) may be coupled to the oscillator output 10a in the case of 16QAM operation,
four oscillator cores (e.g. 101, 102, 103, 104) may be coupled to the oscillator output 10a in the case of 64QAM operation.

Those of skill in the art will otherwise appreciate that the plurality of oscillator cores (here exemplified as including four oscillator cores) may be extended to any number N of oscillator cores, possibly with a value for N which increases as the "cardinality" of the modulation scheme (e.g. 128QAM, 256QAM, and so on). Similarly, only two oscillator cores (e.g. 101 and 102) may be included in systems where e.g. only QPSK and 16QAM are foreseen as modulation options.

In one or more embodiments as schematically represented in FIG. 2, the switches 14 may be configured (in a manner known per se) in such a way that coupling plural oscillator cores to the oscillator output 10a may involve coupling the oscillator cores being coupled in parallel to each other.

In one or more embodiments, such parallel coupling was found to facilitate lowering the phase noise of the oscillator circuit 10 by a factor of N where N is the number of cores coupled to the oscillator output 10a.

Whatever the coupling strategy, in one or more embodiments the different oscillator cores 101, 102, 103, 04, . . . may be activated—that is switched on—(only) when coupled to the oscillator output 10a.

In one or more embodiments, overall phase noise performance may thus be adapted (e.g. dynamically) to the application specifications by correspondingly increasing the oscillator overall power consumption in a selective manner, so that power consumption is increased (only) inasmuch as this may facilitate reducing phase noise.

For instance, power absorption by four oscillator cores will occur only when those four oscillators are actually coupled to the oscillator output 10a, while power consumption may be correspondingly reduced when a smaller number of oscillator cores is actually used by coupling them to the oscillator output 10a.

In one or more embodiments, the various oscillator cores (e.g. 101, 102, 103, 104—it is once more recalled that four oscillator cores are presented here merely by way of example, with no intended limitations for the embodiments) may exhibit a same circuit topology.

Figure 3:
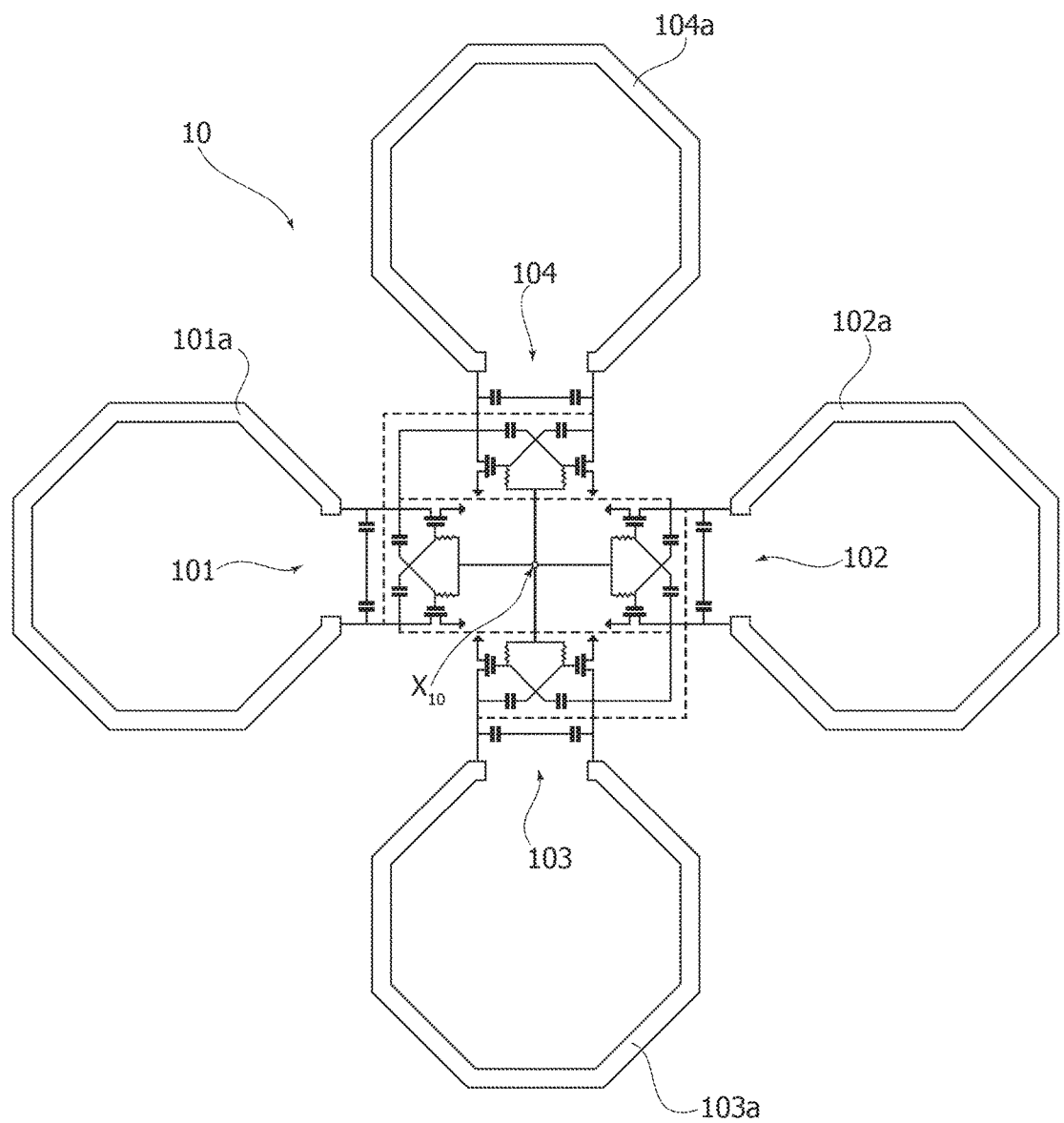
FIG. 3 is a more detailed circuit representation of an oscillator circuit.

The "topology" of an electronic circuit is the form taken by the network of interconnections of the circuit components. At least notionally, different specific values or ratings of the components (e.g. transistors, capacitors, resistors and inductors as schematically shown in FIGS. 2 and 3) may be regarded as being the same topology. Topology is not concerned with the physical layout of components in a circuit, nor with their position on a circuit diagram but is only concerned with what connection exists between the components.

In one or more embodiments, as exemplified herein, in addition to having a same circuit topology, e.g. a bi-stable oscillator topology, the various oscillator cores 101, 102, 103, 104, . . . may have identical circuit layouts.

In one or more embodiments, the same circuit topology of the various oscillator cores 101, 102, 103, 104, . . . may include inductors 101a, 102a, 103a, 104a, . . . in the form of planar inductors (as currently included in integrated circuits—see, e.g. FIG. 3).

In one or more embodiments, this may facilitate integration of the oscillator circuit according to a symmetrical layout, e.g. with mirror-like symmetry of pairs of cores.

Optionally, as exemplified in the figures, the various oscillator cores 101, 102, 103, 104, . . . may be arranged with a circular symmetry around a central axis $X_{10}$.

In one or more embodiments, as exemplified in FIG. 3 (where the configuration switches 14 are not visible for the sake of simplicity) the inductors 101a, 102a, 103a, 104a may be arranged in a petal-like (flower-like) pattern around the central axis $X_{10}$ with the planar inductors 101a, 102a, 103a, 104a forming the petals of the petal-like pattern.

A symmetrical layout of the multi-core oscillator circuit e.g. as exemplified in FIGS. 2 and 3 was found to facilitate e.g. reducing noise current due to core mismatching while also lowering interconnection impedance.

In one or more embodiments, the various oscillator cores 101, 102, 103, 104 may share a common bias control circuit 16 (see e.g. FIG. 2).

In one or more embodiments, the various oscillator cores 101, 102, 103, 104 may be controlled—e.g. with the configuration switches 14 actuated under supervision from the modulation device 12—in such a way as to produce:
selective coupling of the respective oscillator core to the oscillator output 10a; and/or
selective turning on and off of the respective oscillator core so that the respective oscillator core is selectively activatable when coupled to the oscillator output 10a and deactivatable when not coupled to the oscillator output 10a.

In one or more embodiments, actuation (activation/deactivation) of the switches 14 may occur via actuation pins 106 schematically shown in FIG. 2, wherein the respective control lines (e.g. from the bias control circuit 16) are not visible for the sake of clarity of representation.

That is, in one or more embodiments, each oscillator core 101, 102, 103, 104 may be activated/deactivated (e.g. via switches 14 associated with the lines from the common bias control circuit 16 of FIG. 2) in order to be activated (turned on) only when coupled to the oscillator output 10a and otherwise de-activated (turned off), in order to reduce power consumption when not coupled to the oscillator output 10a.

In one or more embodiments, a same set of switches 14 may thus produce:
activation (turn-on) of an oscillator core (e.g. 101 to 104) and coupling thereof with the oscillator output 10a, possibly in parallel with one or more other oscillator cores,
de-activation (turn-off) of an oscillator core and de-coupling thereof from the oscillator output 10a.

In one or more embodiments, the various oscillator cores 101, 102, 103, 104 may be voltage controlled oscillator (VCO) cores.

Tests performed with an adjustable 4-core 20 GHz VCO as exemplified herein, implemented in the form of a CMOS (BiCMOS) RF VCO, have demonstrated average phase noise values of −112, −115, −117 (Avg PN@ 1 MHz [dBc/Hz]) with one, two and four oscillator cores, respectively, activated and coupled (in parallel) to the oscillator output. Power dissipation values of 11.8 mW, 21.6 mW and 37.2 mW were measured with bias currents (Idc) of 9.8 mA, 18 mA, and 31 mA, respectively, with Figure of Merit (FoM) values of 187.6 dBc/Hz, 188 dBc/Hz, and 187.6 dBc/Hz.

Without prejudice to the underlying principles, the details and embodiments may vary, even significantly, with respect to what has been described by way of example only without departing from the extent of protection.

The extent of protection is defined by the annexed claims.

The invention claimed is:

1. An oscillator, comprising:
   a first oscillator core including a first bias input node and further including a first output node and a second output node with a first planar inductor coupled between the first and second output nodes of the first oscillator core;
   a second oscillator core including a second bias input node and further including a third output node and a fourth output node with a second planar inductor coupled between the third and fourth output nodes of the second oscillator core;
   a first switch coupled between the first output node and the third output node;
   a second switch coupled between the second output node and the fourth output node;
   a bias control circuit having a bias output node;
   a third switch coupled between the bias output node and the first bias input node; and
   a fourth switch coupled between the bias output node and the second bias input node;
   wherein said first and second switches are selectively actuated to selectively connect the first and second oscillator cores in parallel to generate an output oscillation signal; and
   wherein said third and fourth switches are selectively actuated to selectively enable oscillation operation of the first and second oscillator cores, respectively.

2. The oscillator of claim 1, further comprising:
   a third oscillator core including a third bias input node and further including a fifth output node and a sixth output node with a third planar inductor coupled between the fifth and sixth output nodes of the third oscillator core;
   a fifth switch coupled between the first output node and the fifth output node;
   a sixth switch coupled between the second output node and the sixth output node; and
   a seventh switch coupled between the bias output node and the third bias input node;
   wherein said first, second, fifth and sixth switches are selectively actuated to selectively connect the first, second and third oscillator cores in parallel to generate an output oscillation signal; and
   wherein said third, fourth and seventh switches are selectively actuated to selectively enable oscillation operation of the first, second and third oscillator cores, respectively.

3. The oscillator of claim 2, wherein said first, second and third oscillator cores have identical circuit layouts.

4. The oscillator of claim 2, wherein said first, second and third oscillator cores are arranged symmetrically around a central axis.

5. The oscillator of claim 4, wherein the symmetrical arrangement has a circular symmetry.

6. The oscillator of claim 4, wherein the planar inductors of the first, second and third oscillator cores are arranged radially extending from the central axis.

7. The oscillator of claim 1, further comprising:
   a modulation device configured to receive said output oscillating signal, said modulation device operable with a plurality of phase noise thresholds, and
   wherein said first through fourth switches are selectively actuated as a function of a phase noise threshold of said modulation device.

* * * * *